US008933616B2

(12) United States Patent
Keser et al.

(10) Patent No.: US 8,933,616 B2
(45) Date of Patent: Jan. 13, 2015

(54) LIGHT EMITTING DEVICE WITH SPRING-LOADED LED-HOLDER

(75) Inventors: Merijn Keser, Eindhoven (NL); Wouter Oepts, Eindhoven (NL); Edwin Petrus Helena Van Lier, Eindhoven (NL); Ralph Hubert Peters, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/002,134

(22) PCT Filed: Feb. 15, 2012

(86) PCT No.: PCT/IB2012/050681
§ 371 (c)(1),
(2), (4) Date: Aug. 29, 2013

(87) PCT Pub. No.: WO2012/117310
PCT Pub. Date: Sep. 7, 2012

(65) Prior Publication Data
US 2013/0334953 A1    Dec. 19, 2013

(30) Foreign Application Priority Data
Mar. 3, 2011   (EP) ..................... 11156862

(51) Int. Cl.
*H01L 33/62*   (2010.01)
*H01L 33/64*   (2010.01)
(Continued)

(52) U.S. Cl.
CPC .............. *H05B 33/02* (2013.01); *F21V 19/001* (2013.01); *F21V 29/004* (2013.01); *F21Y 2101/02* (2013.01); *F21V 29/20* (2013.01); *F21V 29/246* (2013.01)
USPC ............. 313/46; 313/498; 362/294; 362/373; 362/311.02

(58) Field of Classification Search
CPC . H01L 33/64–33/348; F21V 19/001–19/0055; F21V 29/002; F21V 29/004; F21V 29/02; F21V 29/022; H05B 33/0803; H05B 33/08; H01R 13/24; H01R 13/2421
USPC ............ 313/498–512, 46; 362/373, 294, 362; 362/311.02, 311.13, 231
See application file for complete search history.

(56) References Cited

U.S. PATENT DOCUMENTS 6,582,100 B1 *  6/2003  Hochstein et al. ............ 362/294
7,905,632 B2    3/2011  Dobler
(Continued)

FOREIGN PATENT DOCUMENTS

DE    102007049310 A1    4/2009
WO      02/12788 A1      2/2002
(Continued)

*Primary Examiner* — Mariceli Santiago

(57) ABSTRACT

A light-emitting device (1), comprising an LED-module (3) comprising at least one LED mounted on a carrier and at least one connection pad (10a-b) for electrical connection of the LED module (3), a heat dissipator (2) for dissipating heat generated by the LED when in operation, a connection board (4) comprising a substrate having a conductor pattern for enabling provision of external power to the LED module (3), an interconnecting arrangement (7a-d) comprising at least one connection spring (7a-d) attached to the connection board (4) electrically interconnecting the at least one connection pad (10a-b) of the LED module (3) with the conductor pattern of the connection board (4), and an LED-holder comprising at least one holding spring (7a-d) attached to the connection board (4) exerting a spring force there by pressing the LED-module (3) against the heat dissipator (2) to provide a thermal connection between the LED-module (3) and the heat dissipator (2). The interconnecting arrangement (7a-d) is configured to allow movement between the conductor pattern of the connection board (4) and the at least one connection pad (10a-b). The at least one connection spring (7a-d) constitutes the at least one holding spring (7a-d), to simultaneously electrically interconnect the at least one connection pad (10a-b) of the LED-module (3) with the conductor pattern of the connection board (4) and press the LED-module (3) against the heat dissipator (2).

20 Claims, 3 Drawing Sheets

(51) Int. Cl.
*H05B 33/02* (2006.01)
*F21V 19/00* (2006.01)
*F21V 29/00* (2006.01)
*F21Y 101/02* (2006.01)

(56) References Cited

U.S. PATENT DOCUMENTS

2006/0044840 A1* 3/2006 Watanabe et al. .............. 362/647
2008/0224166 A1* 9/2008 Glovatsky et al. .............. 257/99
2010/0208480 A1* 8/2010 Matsunaga ................... 362/509
2012/0051068 A1* 3/2012 Pelton et al. ................... 362/373
2012/0287602 A1* 11/2012 Urano ............................. 362/84
2013/0187190 A1* 7/2013 Muramatsu et al. ............ 257/99

FOREIGN PATENT DOCUMENTS

| WO | 2006/049086 A1 | 5/2006 |
| WO | 2009128005 A1 | 10/2009 |
| WO | 2009150590 A1 | 12/2009 |

* cited by examiner

LIGHT EMITTING DEVICE WITH SPRING-LOADED LED-HOLDER

CROSS-REFERENCE TO PRIOR APPLICATIONS

This application is the U.S. National Phase application under 35 U.S.C. §371 of International Application No. PCT/IB2012/050681, filed on Feb. 15, 2012, which claims the benefit of EP11156862.2 filed on Mar. 3, 2011. These applications are hereby incorporated by reference herein.

FIELD OF THE INVENTION

The present invention relates to a LED-based light-emitting device.

BACKGROUND OF THE INVENTION

LED-based light-emitting devices are becoming more and more popular. One of the reasons for this popularity is the long lifetime of LEDs (light-emitting diodes). However, the lifetime of currently available LED-based light-emitting devices may sometimes be limited not by the LEDs themselves, but by other parts of the light-emitting device, such as the electrical connection between LED-module and circuit board.

In currently available LED-based light-emitting devices, a LED-module is often soldered to a regular printed circuit board (PCB), which may often be made of, for example, FR-4. Due to mismatch in the thermal expansion behavior of the LED-module and the PCB, temperature cycling may eventually result in defects in the solder connection between the LED-module and the PCB, which may lead to premature failure of the LED-based light-emitting device.

WO02/12788A1 discloses a LED assembly including an electrically and thermally conductive heat dissipater sandwiched under an electrically insulating layer with circuit traces disposed over the insulating layer to prevent electrical conduction between the traces and the heat dissipater. A plurality of LEDs have electrical leads extending laterally from opposite extremities of each LED to overlie the traces for electrical contact with the traces for powering the LEDs. An independent and generally U-shaped holding device, as viewed in cross section, defines a base overlying the LED and a pair of legs depending therefrom and transversely to the electrical leads between the LED and the heat dissipater. The base defines a hole and the LED protrudes through the hole to emit light. The insulating layer includes a void surrounding each LED and the legs of each associated holding device and each holding device includes a tensioning portion for applying a force urging the LED through the void and into thermal engagement with the heat dissipater and the electrical leads thereof into engagement with the traces. To solve this problem and to prolong the life of LED-based light-emitting devices, it has been proposed to replace the regular PCB with a circuit board that has a coefficient of thermal expansion that more closely matches that of the LED-module. Such a circuit board may, for example, be ceramic-based. Although solving the lifetime problem, the replacement of the regular PCB by a ceramic-based circuit board results in a higher cost. Furthermore, ceramic-based circuit boards are brittle, which may limit the form factor of the light-emitting device.

SUMMARY OF THE INVENTION

In view of the above-mentioned and other drawbacks of the prior art, a general object of the present invention is to provide an improved LED-based light-emitting device combining a long lifetime with the potential for low cost solutions.

According to the present invention there is provided a light-emitting device, comprising: an LED-module comprising at least one LED or LED die mounted on a carrier and at least one connection pad for electrical connection of the LED module; a heat dissipator for dissipating heat generated by the LED when in operation; a connection board comprising a substrate having a conductor pattern for enabling provision of external power to the LED module; an interconnecting arrangement electrically interconnecting the at least one connection pad of the LED module with the conductor pattern of the connection board; and an LED-holder pressing the LED-module against the heat dissipator to provide a thermal connection between the LED-module and the heat dissipator, wherein: the interconnecting member is configured to allow movement between the conductor pattern of the connection board and the at least one connection pad; and the LED-holder exerts a spring force to press the LED-module against the heat dissipator.

The present invention is based on the realization that an improved lifetime of a LED-based light-emitting device can be achieved at a lower cost than in prior art solutions by pressing the LED-module against the heat dissipator using a spring force and providing an electrical connection between the connection board and the LED-module that allows at least lateral movement between the conductor pattern of the connection board and the connection pad of the LED-module. Hereby, a robust electrical connection as well as good heat dissipation is provided even when there is a substantial mismatch between the coefficients of thermal expansion of the LED-module (often ceramic-based) and the connection board (typically FR-4 or similar). This provides for a light-emitting device with a long lifetime and at a lower cost and/or with a greater design flexibility than other proposed solutions, such as using a connection board in the same material as the LED-module.

According to the present invention, the LED-holder is advantageously formed by the connection board and at least one holding spring attached to the connection board. By using the connection board rather than a separate part for the LED-holder, cost can be kept down.

The interconnecting arrangement comprises at least one electrically conducting connection spring attached to the connection board and in electrical contact with the conductor pattern of the connection board, the at least one connection spring exerting a spring force to press against the at least one connection pad of the LED-module to electrically interconnect the at least one connection pad of the LED-module with the conductor pattern of the connection board. Hereby, electrical interconnection is provided, while allowing some movement (due to thermal mismatch) between the LED-module and the connection board. The electrical connection between the connection spring(s) and the connection pad(s) can be made to remain intact over a large number of cycles of relative movement between the connection spring(s) and the connection pad(s), and can thus be made more reliable than a "normal" solder connection would be. The at least one connection spring may advantageously be made of metal.

According to the invention, the at least one connection spring constitutes the at least one holding spring, to simultaneously electrically interconnect the at least one connection pad of the LED-module with the conductor pattern of the connection board and press the LED-module against the heat dissipator. Accordingly, the connection spring will fulfill two functions—to provide a reliable electrical connection between the LED-module and the connection board, and to press the LED-module against the heat dissipator to efficiently dissipate heat generated by the LED(s) comprised in the LED-module when the light-emitting device is in operation.

In the case that the at least one connection spring does not constitute the at least one holding spring, the at least one holding spring may exert a greater force on the LED-module than the at least one connection spring exerts on the LED-module. Through such a dimensioning of the different springs, the connection spring may be optimized for providing a contact force on the connection pad of the LED-module that is sufficient to provide electrical connection, but not necessarily to ensure a good thermal connection between the LED-module and the heat dissipator, while the holding spring may be dimensioned to provide a force that is sufficient to achieve a good thermal connection. In this way, a good thermal connection to the heat dissipator can be achieved while at the same time avoiding or at least significantly reducing contact surface wear on the connection pad(s) of the LED-module, which in turn reduces the risk of corrosion and accompanying contact resistance. Further, to provide for the desired combination of very low contact surface wear and a good thermal connection in this case, the at least one holding spring may advantageously be dimensioned to exert a pressure on the LED-module that is at least 20% higher than the force exerted by the at least one connection spring on the its associated contact pad(s). Moreover, the at least one holding spring and the at least one connection spring in this case may be provided as different portions of a single sheet of a resilient material, such as sheet metal, whereby the above-mentioned dual functionality can be achieved using a single piece comprising a holding spring portion and a connection spring portion. This provides for simple and cost-efficient manufacturing.

According to the various embodiments of the present invention, the connection board may advantageously comprise an opening accommodating the LED-module, such that the LED-module is at least partly surrounded by the connection board. The design of the connection board, including the position and shape of the opening can easily be adapted to different LED-modules, which simplifies upgrades etc involving using another LED-module in the light-emitting device.

The opening in the connection board may be substantially rectangular, and springs may be provided on opposite sides of the opening.

Moreover, the at least one holding spring and/or the at least one connection spring may advantageously be soldered to the connection board.

In an embodiment the connection board comprises a moulded interconnect device into which one end of the at least one holding spring is clamped. This clamping provides for an improved mechanical fixation of the at least one holding spring. In a further embodiment the moulded interconnect device comprises a hole filled with solder which is electrically contacting a part of the at least one holding spring. In this way the mechanical fixation of the at least one holding spring by the moulded interconnect device induces less stress on the solder. The solder may electrically contact a conduction pattern of the moulded interconnect device.

To provide for a low form factor and automated production using standard electronics manufacturing equipment, the at least one holding spring and/or the at least one connection spring may, furthermore, be a leaf spring. Leaf springs, which may be made of sheet metal, can be arranged using pick-and-place machinery, and can be soldered to the connection board.

BRIEF DESCRIPTION OF THE DRAWINGS

These and other aspects of the present invention will now be described in more detail, with reference to the appended drawings showing example embodiments of the invention, wherein.

DESCRIPTION OF EXAMPLE EMBODIMENTS
OF THE PRESENT INVENTION

In the following description, the present invention is described with reference to a LED-based light-emitting device in which the connection board has a rectangular opening that completely surrounds the LED-module and sheet metal leaf springs are soldered to the connection board.

It should be noted that this by no means limits the scope of the invention, which is equally applicable to other light-emitting devices having an LED-holder that exerts a spring force to press the LED-module against the heat dissipator and an interconnecting member that allows movement between the connection pad(s) of the LED-module and the conductor pattern of the connection board. For example, other kinds of springs, such as one or several helical springs or plate springs, could be used to press the LED-module against the heat dissipator. Moreover, the interconnecting member may provide the desired relative lateral movement by other means, such as through a flexible wire that is electrically connected to the conductor pattern of the connection board and the connection pad(s) of the LED-module.

Figure 1:
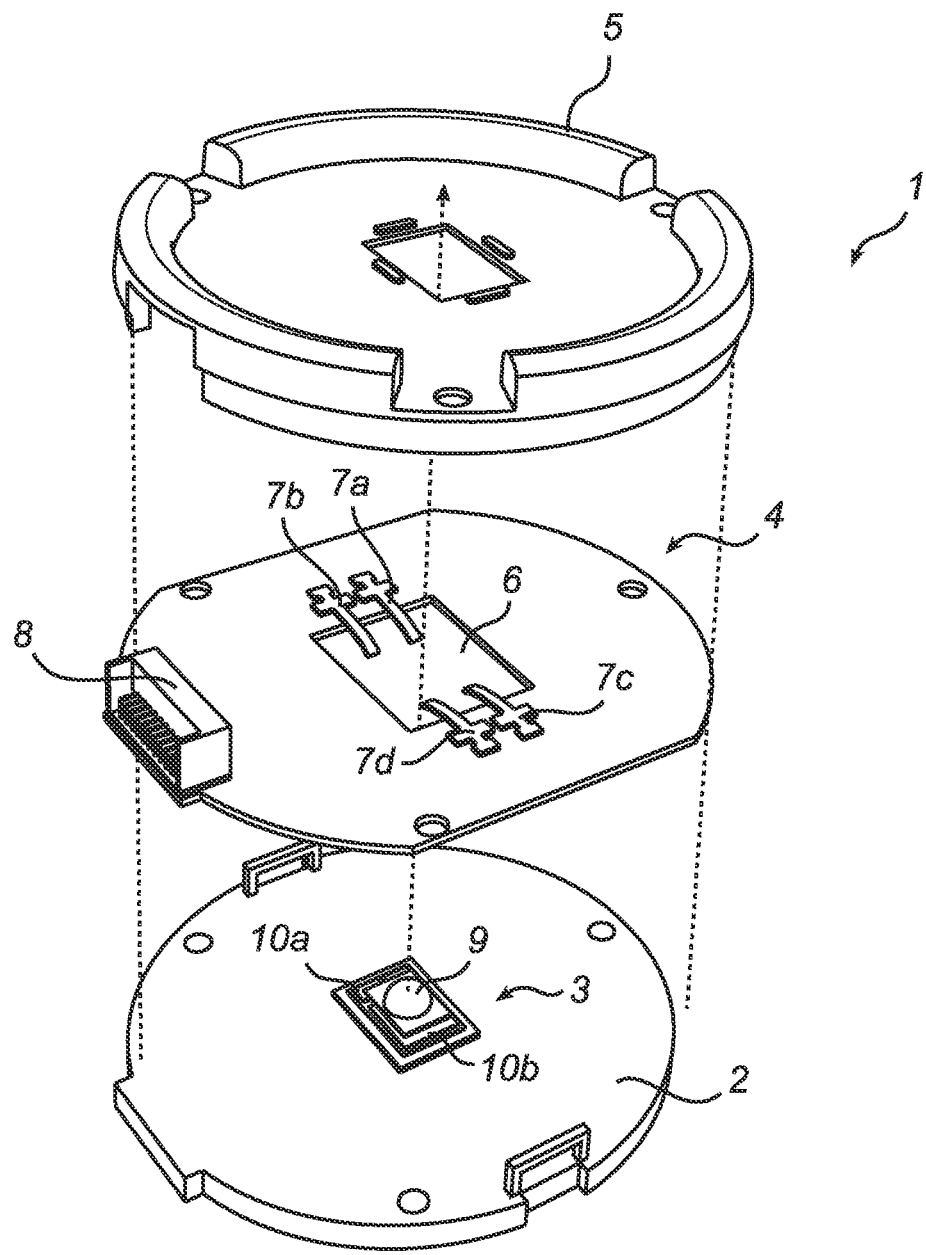
FIG. 1 is an exploded view of a first exemplary embodiment of the light-emitting device according to the present invention.

FIG. 1 is an exploded view of a first embodiment of the light-emitting device according to the present invention. With reference to FIG. 1, the light-emitting device 1 comprises a heat dissipator in the form of a metal heat sink 2, a LED-module 3, a connection board 4 and a cover 5. As can be seen in FIG. 1, the light-emitting device 1 further comprises springs 7a-d and a connector 8 for allowing the provision of external power to the LED(s) in the LED-module 3. The springs 7a-d and the connector 8 are soldered to a conductor pattern (not shown) of the connection board 4 so that at least two of the springs 7a-d are connected to appropriate pins of the connector 8. The LED-module 3 is provided with at least one LED (covered by the lens 9 in FIG. 1) and two connector pads 10a-b for allowing electrical connection to the LEDs. Furthermore, the connection board has a rectangular opening 6 that accommodates the LED-module 3.

As can easily be understood from FIG. 1, the springs 7a-d will press against the connector pads 10a-b of the LED-module 3 when the light-emitting device 1 is assembled, so that electrical connection between the connector 8 and the LEDs is achieved while at the same time pressing the LED-module 3 against the heat sink 2.

Thus, in the first embodiment described above with reference to FIG. 1, the springs 7a-d perform the double function of providing electrical connection between the appropriate pins of the connector 8 and the LEDs of the LED-module 3 and pressing the LED-module against the heat sink 2.

Figure 2:
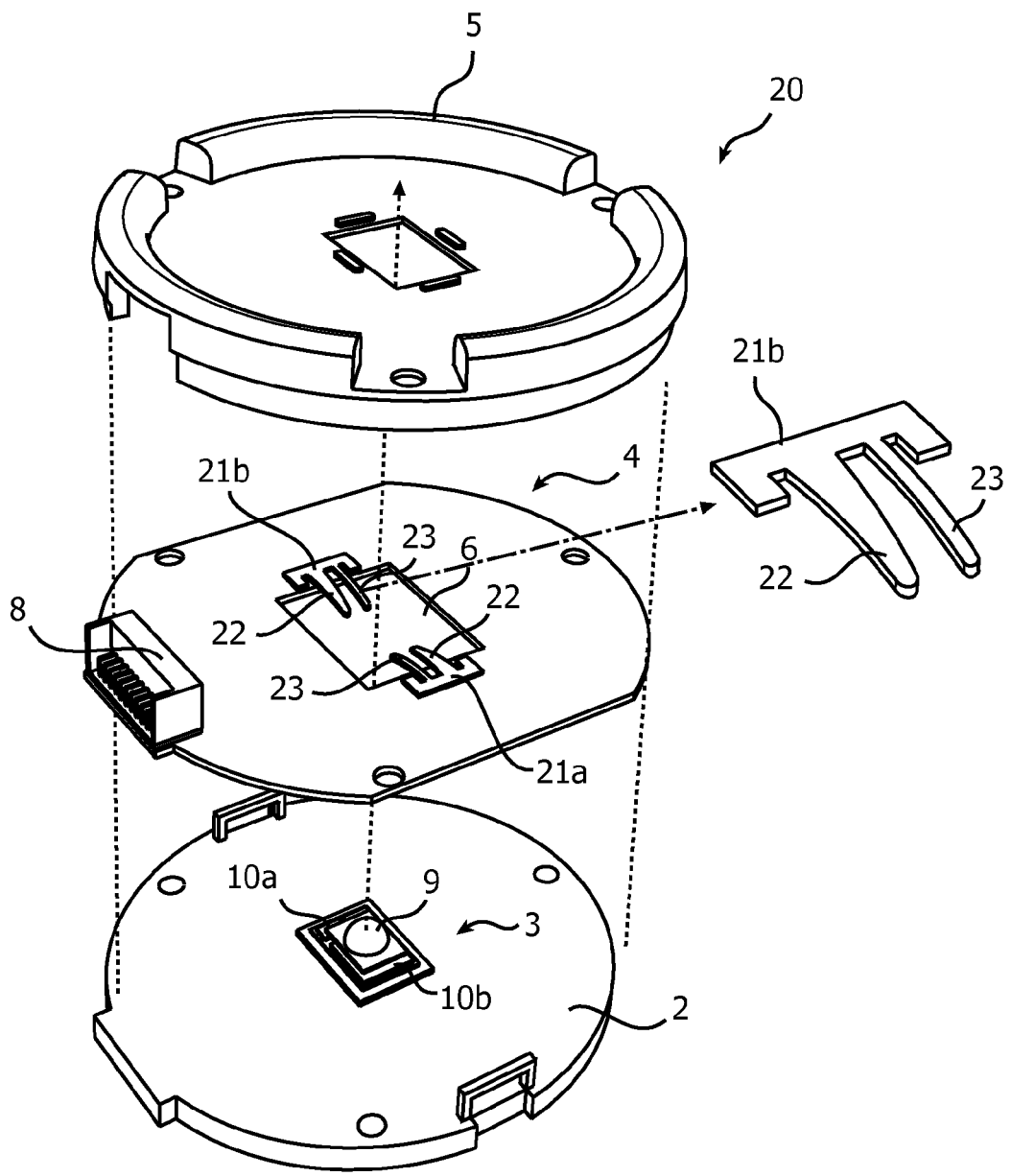
FIG. 2 is an exploded view of a light-emitting device.

FIG. 2 schematically shows a light-emitting device 20, which differs from that described above with reference to FIG. 1 in that the electrical connection between the connector pads 10a-b of the LED-module 3 and the connector 8 and the pressing of the LED-module 3 against the heat sink 2 is achieved by spring arrangements 21a-b made of sheet metal. The spring arrangements 21a-b are, as can be seen in FIG. 2, attached to the connection board 4 on opposite sides of the substantially rectangular opening 6. As is also shown in FIG. 2, each of the spring arrangements 21a-b comprises a connection spring portion 23 and a holding spring portion 22. The connection spring portion 23 has a relatively narrow profile and the holding spring portion 22 has a relatively wide profile, which means that the holding spring portion 22 has a higher spring constant than the connection spring portion. The connection spring portion 22 is dimensioned so that the force exerted by the connection spring portion 23 on the connection pad(s) 10a-b of the LED-module 3 becomes sufficiently high to achieve a reliable electrical connection between the connection spring portion 23 and the connection pad(s) 10a-b, but not so high that it results in contact surface wear over time. In other words, the connection spring portion 23 is dimensioned to achieve the function of electrically interconnecting the connection pad(s) of the LED-module with the conductor pattern of the connection board 4. In order to achieve the function of pressing the LED-module 3 against the heat sink 2, the holding spring portion 22 is dimensioned to exert a substantially higher force on the LED-module 3 when the light-emitting device 20 is assembled.

Figure 3:
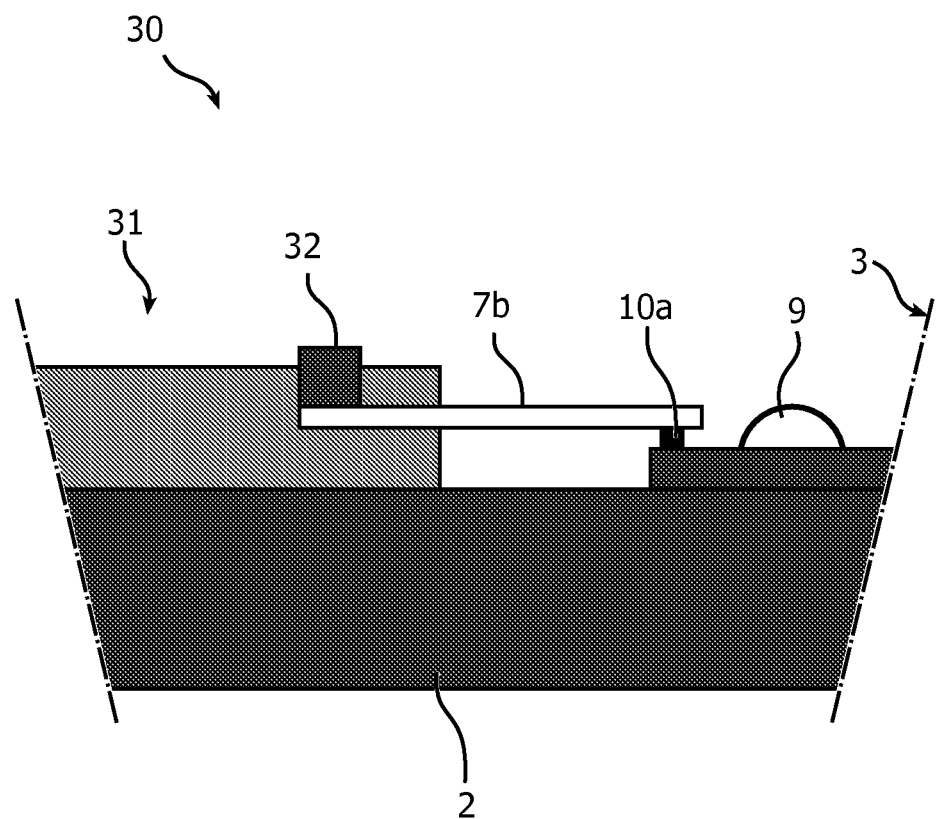
FIG. 3 is a schematic cross-section of another exemplary embodiment of the light-emitting device according to the present invention.

FIG. 3 is a schematic cross-section of an embodiment of a light-emitting device 30 according to the present invention. The light-emitting device 30 is in most aspects similar to the embodiments described with reference to FIG. 1, the main difference being the connection board which for this embodiment is a molded interconnect device (MID) 31. With reference to FIG. 3, the light-emitting device 30 comprises the heat dissipator in the form of the metal heat sink 2, the LED-module 3 and the MID 31. The LED-module 3 is provided with at least one LED (covered by the lens 9) and two connector pads 10a-b for allowing electrical connection to the LEDs of which only connector pad 10a is shown in FIG. 3. The light-emitting device 30 further comprises the springs 7a-d of which only the spring 7b is shown in FIG. 3. The springs 7a-d have similar properties as described with reference to FIG. 1. In this embodiment one end of the springs 7a-d is mechanically fixed in the MID 31 and the opposite end of the springs contacts and exerts a pressing force on a part of the LED module 3, for example the connection pads 10a-b for establishing an electrical contact. The springs 7a-d thus press against the connector pads 10a-b of the LED-module 3 when the light-emitting device 30 is assembled, so that an electrical connection between the connector 8 and the LEDs is achieved while at the same time pressing the LED-module 3 against the heat sink 2. The springs 7a-d are electrically connected to the conductor pattern (not shown) of the MID 31 via solder 32 that is applied in vias or openings of the MID 31, which vias or openings expose a part of the springs 7a-d that is clamped inside the MID 31, and thus establishing an electrical interconnection from the conductor pattern of the MID 31 via the springs 7a-d to the connector pads 10a-b. The MID 31 gives more freedom in choosing the shape of the connection board than a for example laminated printed circuit board. This embodiment provides for an improved reliability because the springs 7a-d are clamped in the MID 31, thus achieving an improved mechanical fixation. Furthermore, an improved protection of the solder connection 32 against mechanical forces and stress induced by the springs 7a-d is achieved compared to the fixation of the springs 7a-d with solder as exemplified with respect to FIG. 1.

Additionally, variations to the disclosed embodiments can be understood and effected by the skilled person in practicing the claimed invention, from a study of the drawings, the disclosure, and the appended claims. For example, the opening 6 need not completely surround the LED-module 3. Another example could be found in the design of the spring component: it could be designed as an SMD component (as in the other examples), but also possible is a through-hole component. Or as a component that is inserted into a hole (not below PCB level) scraping into the PCB material. This way a component can be created that can accommodate a higher total force because the solder connection is not the sole interface transmitting the force.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:

1. A light-emitting device, comprising:
    an LED-module comprising at least one LED mounted on a carrier and at least one connection pad;
    a heat dissipator;
    a connection board comprising a substrate having a conductor pattern arranged to provide external power to the LED-module;
    an interconnecting arrangement comprising at least one connection spring fixedly attached to the connection board, the at least one connection spring exerting a spring force to press against the at least one connection pad of the LED-module to electrically interconnect the at least one connection pad of the LED-module with the conductor pattern of the connection board, the interconnecting arrangement being configured to allow movement between the conductor pattern of the connection board and the at least one connection pad;
    and an LED-holder formed by the connection board and at least one holding spring fixedly attached to the connection board, the at least one holding spring exerting a spring force thereby pressing the LED-module against the heat dissipator to provide a thermal connection between the LED-module and the heat dissipator,
    wherein the at least one connection spring constitutes the at least one holding spring, to simultaneously electrically interconnect the at least one connection pad of the LED-module with the conductor pattern of the connection board and press the LED module against the heat dissipator, and
    wherein the spring force of the at least one holding spring is at least 20% greater than the spring force of the at least one connection spring.

2. The light-emitting device according to claim 1, wherein the connection board comprises an opening accommodating the LED-module, such that the LED-module is at least partly surrounded by the connection board.

3. The light-emitting device according to claim 2, wherein the opening is substantially rectangular.

4. The light-emitting device according to claim 3, wherein the LED-holder comprises a first set of springs attached to the connection board on a first side of the LED-module and a second set of springs attached to the connection board on a second side of the LED-module opposite the first side of the LED-module.

5. The light-emitting device according to claim 1, wherein the at least one holding spring is soldered to the connection board.

6. The light-emitting device according to claim 1, wherein the at least one holding spring is a leaf spring.

7. The light-emitting device according to claim 1, wherein the connection board comprises a moulded interconnect device into which one end of the at least one holding spring is clamped.

8. The light-emitting device according to claim 7, wherein the moulded interconnect device further comprises a hole filled with solder which is connected to a part of the at least one holding spring.

9. A light emitting device, comprising:
  an LED-module that includes at least one light emitting element mounted on a carrier that includes at least one connection pad;
  a heat dissipator; and
  a connection board that includes:
    a conductor pattern arranged to provide power to the LED-module;
    at least one connection spring affixed to the board that exerts a spring force against the at least one connection pad to electrically connect the at least one connection pad and the conductor pattern; and
    at least one holding spring affixed to the board that exerts a spring force against the LED module to thermally connect the LED module to the heat dissipator;
  wherein the holding spring is configured to exert at least 20% more spring force than the connection spring.

10. The light emitting device of claim 9, wherein the at least one connection spring and the at least one holding spring are leaf springs.

11. The light emitting device of claim 10, wherein the at least one holding leaf spring has more mass than the at least one connection leaf spring.

12. The light emitting device of claim 9, wherein the at least one holding spring and the at least one connection spring are integrally connected.

13. The light emitting device of claim 9, wherein the at least one holding spring and the at least one connection spring are soldered to the connection board.

14. The light emitting device of claim 9, wherein the connection board comprises a molded interconnection device, and an end of the at least one holding spring is molded into the molded interconnection device.

15. The light-emitting device of claim 9, wherein the connection board comprises an opening that accommodates the LED-module, such that the LED-module is at least partly surrounded by the connection board.

16. The light-emitting device of claim 15, wherein the connection board includes at least two connection springs and at least two holding springs affixed to the connection board, and each of two connection springs and each of two holding springs are situated on opposite edges of the perimeter of the opening.

17. The light-emitting device of claim 9, wherein the spring force that is exerted by the connection spring allows for movement of the contact pad with respect to the connection spring.

18. A method of assembling a light-emitting device comprising:
  providing an LED module that includes at least one a light emitting device on a carrier that includes at least one connection pad;
  providing a connection board that includes:
    a conductor pattern arranged to provide power to the LED-module;
    at least one connection spring affixed to the board; and
    at least one holding spring affixed to the board;
  situating the LED module upon a heat dissipator; and
  affixing the connection board to the heat dissipator, such that:
    the connection spring exerts a spring force against the at least one connection pad to electrically connect the at least one connection pad and the conductor pattern; and
    the holding spring exerts a spring force against the LED module to thermally connect the LED module to the heat dissipator with a spring force that is at least 20% greater than the spring force of the connection spring.

19. The method of claim 18, wherein the at least one connection spring and the at least one holding spring are leaf springs.

20. The method of claim 19, wherein the at least one holding leaf spring has more mass than the at least one connection leaf spring.

* * * * *